US007279982B1

(12) United States Patent
Zhou et al.

(10) Patent No.: US 7,279,982 B1
(45) Date of Patent: Oct. 9, 2007

(54) APPARATUS AND METHOD FOR LOW CURRENT DIFFERENTIAL SWING I/O INTERFACE

(75) Inventors: Shi-dong Zhou, Milpitas, CA (US); Andy T. Nguyen, San Jose, CA (US); Gubo Huang, Milpitas, CA (US)

(73) Assignee: Xilinx, Inc., San Jose, CA (US)

( * ) Notice: Subject to any disclaimer, the term of this patent is extended or adjusted under 35 U.S.C. 154(b) by 190 days.

(21) Appl. No.: 11/089,848

(22) Filed: Mar. 24, 2005

(51) Int. Cl.
*H03F 3/04* (2006.01)

(52) U.S. Cl. ........................................ 330/301; 330/51

(58) Field of Classification Search .................. 330/51, 330/301

See application file for complete search history.

(56) References Cited

U.S. PATENT DOCUMENTS 5,900,960 A * 5/1999 Reime ........................ 398/202
6,208,446 B1 * 3/2001 Faifman ..................... 398/136
7,126,419 B2 * 10/2006 Miyasita ...................... 330/69

* cited by examiner

*Primary Examiner*—Khanh Van Nguyen
(74) *Attorney, Agent, or Firm*—Marc R. Ascolese; Justin Liu

(57) ABSTRACT

Low current differential signal/swing I/O interfaces and techniques can be implemented. An output interface converts input data signals to differential current signals for transmission over transmission lines. When the differential current signals are received by an input interface, they are converted to differential voltage signals and appropriately amplified.

18 Claims, 7 Drawing Sheets

APPARATUS AND METHOD FOR LOW CURRENT DIFFERENTIAL SWING I/O INTERFACE

TECHNICAL FIELD

The present invention relates to input/output (I/O) interface circuits, and particularly to I/O interface circuits having low power consumption.

BACKGROUND

The demand for high-speed data transmission continues to grow as device users become more accustomed to feature-rich electronic devices, high-quality digital media content, and high levels of system performance. For example, consumers demand ever more realistic audio and visual information in home and office applications. This in turn drives the need to move greater amounts of data (e.g., audio, video, 3D graphics and images) among electronic devices and across various types of networks. Thus, numerous techniques exist to move high-speed digital data both very short and very long distances. Moving data from integrated circuit to integrated circuit within an electronic device (e.g., high speed interconnects between integrated circuits), from board to board (e.g., connector and backplane applications), or from electronic device to electronic device generally requires high-performance solutions that consume low amounts of power, generate little noise, are relatively immune to external noise sources, and are cost-effective.

Because the high speed data transmission interface between integrated circuits is important in so many devices and applications, numerous different proprietary and standardized interfaces and communications techniques have been developed. Examples of such interfaces and techniques include: LVDS (low-voltage differential signaling, or low-voltage differential swing), mini-LVDS, PECL (positive-referenced emitter-coupled logic), CML (current mode logic), RSDS, (reduced swing differential signaling), LDT (lightning data transport), and the like. In particular LVDS, is commonly used among many integrated circuit designers and manufactures because it is the subject of TIA/ANSI standards, is relatively easy to implement, can be implemented in CMOS, GaAs or other applicable technologies, can migrate from 5V to 3.3V to sub-3V supplies, and can be transmitted over PCB traces or cables, thereby serving a broad range of applications in many industry segments.

An LVDS output driver includes differential output terminals coupled to a current source (nominal 3.5 mA) that drives a differential pair of signal transmission lines. The basic input driver or receiver has a high DC input impedance, so the majority of driver current flows across a termination resistor, generating about 350 mV across the receiver inputs. When the output driver switches, it changes the direction of current flow across the resistor, thereby creating a valid "one" or "zero" logic state.

In typical LVDS implementations, operation is specified in terms of two key parameters, $V_{OD}$ and $V_{OS}$. $V_{OD}$ is the voltage difference or swing between the two output terminals of the output driver. $V_{OS}$ is the average level of the two output voltage signals. In general, $V_{OS}$ is determined by the equilibrium of pull up and pull down current sources implemented in the output driver. Stronger pull up/weaker pull down tends to raise $V_{OS}$, while weaker pull up/stronger pull down tends to lower $V_{OS}$. Signaling on the two output terminals is controlled by an array of switched between the pull up and pull down current sources.

Despite its relative simplicity, an LVDS implementation can have several disadvantages. Careful control of the pull up and pull down currents typically requires the use of multiple switches in each current source, and controlling those switches in turn requires ample memory and control circuitry. In many integrated circuits, the added cost (e.g., actual cost or consumption of circuit resources) can be high. Additionally, $V_{OD}$ and $V_{OS}$ can vary significantly due to semiconductor manufacturing process, operation temperature, and supply voltage variation. This is largely because the pull up and pull down currents vary significantly over the full range of process/temperature/supply variation. The variation of $V_{OD}$ and $V_{OS}$ can be great enough to push a device beyond the operation specifications of LVDS standards. Finally, typical LVDS implementations do not compensate for supply voltage and ground bounces, which may further cause $V_{OS}$ and $V_{OD}$ to shift.

Accordingly, it is desirable to integrated circuit I/O interfaces and techniques that reduce or eliminate many of the deficiencies of the prior art.

SUMMARY

Low current differential signal/swing I/O interfaces and techniques can be implemented. An output interface converts input data signals to differential current signals for transmission over transmission lines. When the differential current signals are received by an input interface, they are converted to differential voltage signals and appropriately amplified.

Accordingly, one aspect of the present invention provides a circuit comprising a first input driver terminal, a second input driver terminal, at least one termination resistor coupled between the first input driver terminal and the second input driver terminal, a current-to-voltage converter coupled to the first input driver terminal and the second input driver terminal, and a differential amplifier coupled to the current-to-voltage converter. The first input driver terminal is operable to be coupled to a first transmission line. The second input driver terminal is operable to be coupled to a second transmission line. The current-to-voltage converter is configured to sense changing current levels at the first input driver terminal and the second input driver terminal, and produce a differential voltage signal. The differential amplifier is configured to produce an output signal based on the differential voltage signal.

Another aspect of the present invention provides a method. A differential current signal is received from a pair of signal transmission lines. The differential current signal is converted to a differential voltage signal. The differential voltage signal is amplified to form a single-ended output signal.

Another aspect of the present invention provides an apparatus including a means for receiving a differential current signal from a pair of signal transmission lines; a means for converting the differential current signal to a differential voltage signal; and a means for amplifying the differential voltage signal to form a single-ended output signal.

The foregoing is a summary and thus contains, by necessity, simplifications, generalizations and omissions of detail; consequently, those skilled in the art will appreciate that the summary is illustrative only and is not intended to be in any way limiting. As will also be apparent to one skilled in the art, the operations disclosed herein may be implemented in a number of ways, and such changes and modifications may be made without departing from this invention and its broader aspects. Other aspects, inventive features, and advantages of the present invention, as defined solely by the claims, will become apparent in the non-limiting detailed description set forth below.

BRIEF DESCRIPTION OF THE DRAWINGS

A more complete understanding of the present invention and advantages thereof may be acquired by referring to the following description and the accompanying drawings, in which like reference numbers indicate like features.

DETAILED DESCRIPTION

The following sets forth a detailed description of at least the best contemplated mode for carrying out the one or more devices and/or processes described herein. The description is intended to be illustrative and should not be taken to be limiting.

Figure 1:
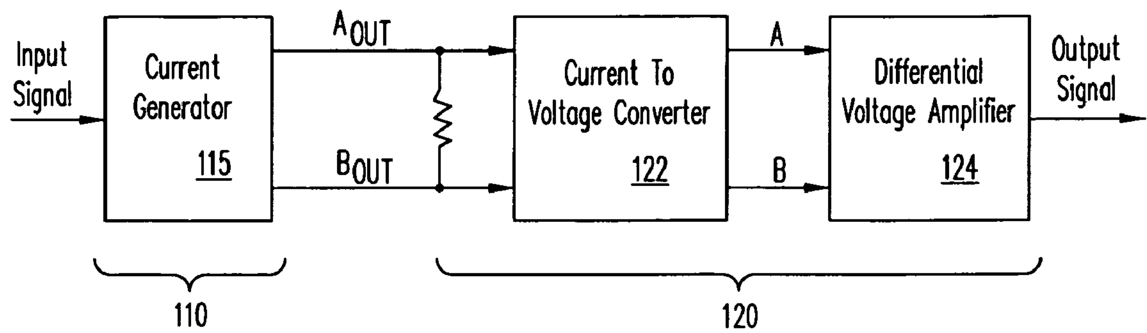
FIG. 1 illustrates a simplified block diagram of components of a low current differential swing (LCDS) system.

FIG. 1 illustrates a simplified block diagram of components of a low current differential swing (LCDS) system 100. LCDS system 100 includes output driver 110 and input driver (sometimes referred to as a receiver) 120. In a typical implementation, an integrated circuit supporting LCDS operation would include one or more implementations of each of output driver 110 and input driver 120, however, such instances of output driver 110 and input driver 120 are typically not coupled to each other as shown in FIG. 1. Instead, LCDS system 100 allows for data transfer between two integrated circuits (not shown), where one produces an output signal using output driver 110, and the other receives the signal at input driver 120.

Unlike LVDS devices, LCDS system 100 transfers data by varying the current levels of output signals $A_{OUT}$ and $B_{OUT}$. Thus, an input data signal (typically single-ended, but in some embodiments it can be differential) is received at current generator 115. Current generator 115 in turn generates differential current signals $A_{OUT}$ and $B_{OUT}$ according to the input signal. Those signals are transferred over suitable transmission lines, e.g., printed circuit board traces, backplanes, cables, and the like, to input driver 120. The signal transmission lines are terminated with one or more resistors as shown. In some embodiments, the termination resistance is 100 Ohm, selected to match typical transmission line impedance to help reduce or eliminate signal reflection and other noise effects. The received signals are converted using current-to-voltage converter 122. Converter 122 produces as its output a differential voltage pair that can then be suitably amplified by amplifier 124 to produce the single-ended output signal.

As will be appreciated by those having ordinary skill in the art, the various components of system 100 can be implemented using a number of circuits and circuit techniques. Moreover, LCDS devices and techniques have a number of advantages over prior art interfaces such as LVDS. In general, implementation of output driver 110 is much simpler as compared to LVDS output drivers. As will be seen below, the circuitry for LCDS output drivers can be relatively simple to implement. As compared with LVDS output drivers, this simplicity of implementation further translates into ease of control and reduced circuit size, both of which reduce the cost of an integrated circuit that includes the output driver. LCDS output drivers are also relatively easy to integrate into existing integrated circuit designs because they can be used by existing device I/O terminals/pins having an open-drain option. Such options are particularly common on programmable devices, allowing a user to drive system level resets, interrupts, enable/disable lines, etc., without the need for off circuit buffers.

Power consumption of LCDS devices is also low compared to LVDS devices. For example, an LCDS system can consume significantly less power per I/O than traditional LVDS implementations because the LCDS output signals $A_{OUT}$ and $B_{OUT}$ swing only approximately 10 mV. Such operation also means that data transfer speeds can generally be very fast, e.g., as high as 620 Mb/s, and that the system injects less noise into integrated circuit power sources (noise that typically causes power supply bounces during switching). These features further allow more I/O interfaces on a particular integrated circuit to operate simultaneously, as compared to LVDS interfaces, where there is a given number of power supplies, ground pads, power supply bus width, etc.

As will be seen below in connection with FIG. 2, LCDS drivers can be implemented using simple bias circuits, further simplifying overall system design and control, and reducing associated costs of the device. LCDS system 100 also possesses very high common mode noise rejection since both $A_{OUT}$ and $B_{OUT}$ will move up and down together tracking, for example, variations in power supply voltage. While LCDS input driver 120 can often be more complicated than comparable LVDS input drivers, e.g., because of added current-to-voltage converting circuitry, the changes are relatively minor and include the addition of a small number of circuit elements.

Figure 2:
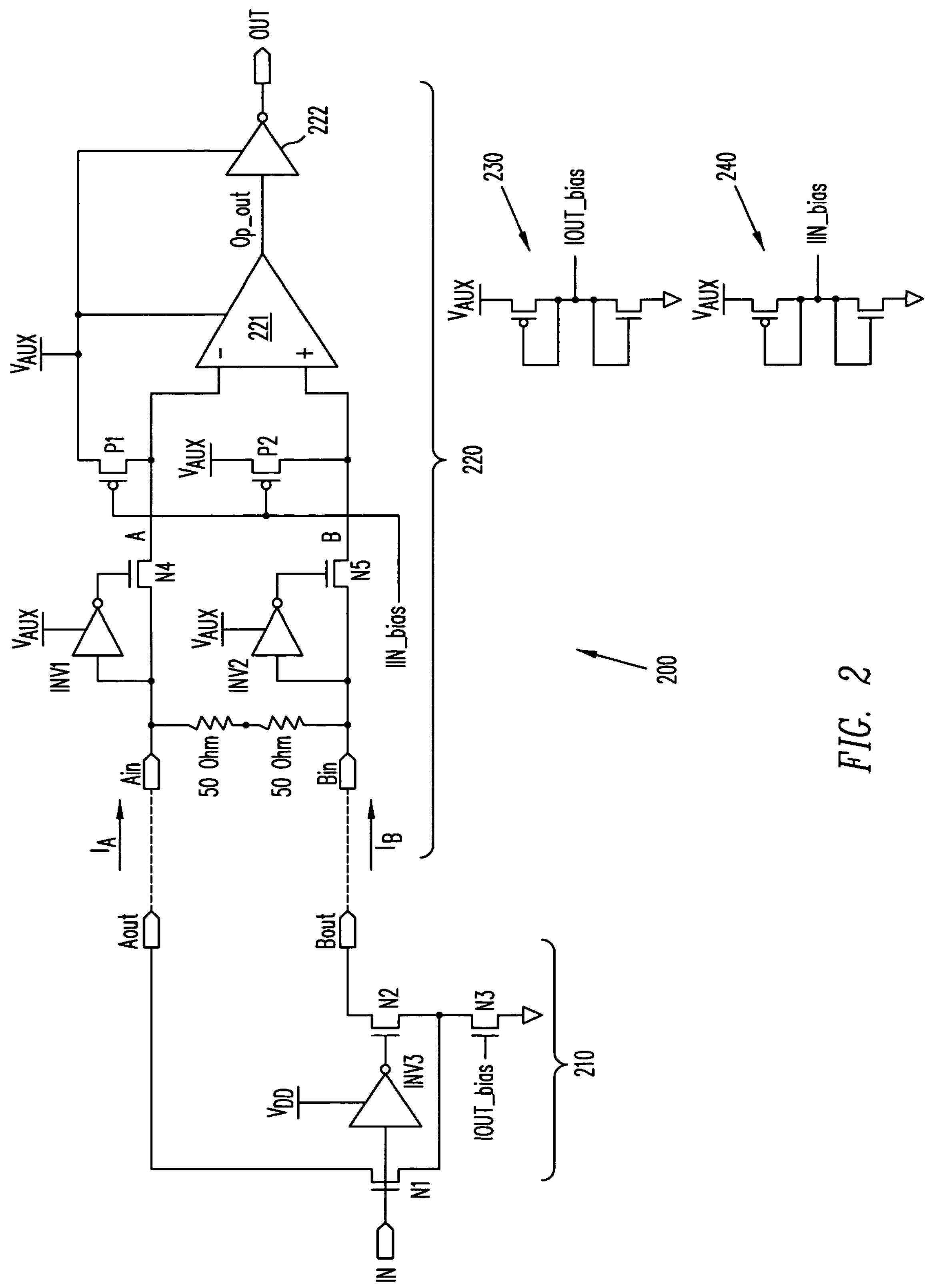
FIG. 2 illustrates a schematic diagram of one implementation of LCDS circuits.

FIG. 2 illustrates a schematic diagram of one implementation of LCDS system 200. As noted above with respect to FIG. 1, the circuit components illustrated are typically implemented on an integrated circuit, but the illustrated connection between output driver and input driver usually is from one integrated circuit to another. Thus, LCDS output driver 210 is typically located on a first integrated circuit (not shown), and LCDS input driver 220 is typically located on a second integrated circuit (not shown). LCDS output driver 210 and LCDS input driver 220 are coupled to each other through some signal path such as PCB traces. In one embodiment the first and second integrated circuits are Programmable Logic Devices (PLDs), such as those sold by Xilinx, Inc. of San Jose, Calif.

LCDS output driver 210 implements a pull down current source. NMOS transistors N1 and N2 selectively pull down output terminals $A_{OUT}$ and $B_{OUT}$ according to the logic state of an input signal applied to the transistor gates (directly in the case of transistor N1 and via inverter INV3 in the case of N2). Thus, depending on the input signal, output driver 210 only sinks current on either $A_{OUT}$ or $B_{OUT}$ to cause the LCDS signal swing. Bias transistor N3 can be controlled using a number of different circuits and techniques. Bias circuit 230 provides one example.

LCDS input driver 220 includes both current-to-voltage and differential amplifier components. Two termination resistors are provided (either internal to the integrated circuit including input driver 220 or external to that integrated circuit) to properly terminate associated signal transmission lines and to develop a voltage based on the LCDS signals received. NMOS transistors N4 and N5, inverters INV1 and INV2, and PMOS transistors P1 and P2 are all used in input driver 220 as part of the current-to-voltage converter circuitry. The resulting signal is appropriately amplified by operational amplifier 221, and inverted by inverter 222 to produce a corresponding output signal. As with output driver 210, relatively simple biasing circuits, such as bias circuit 240 can be used in conjunction with input driver 220. As illustrated in FIG. 2, most circuit components receive their power from $V_{AUX}$ which is typically a power supply line associated with I/O operation, as opposed to $V_{DD}$, which is typically the core supply of the associated integrated circuit. $V_{AUX}$ is often different from $V_{DD}$, and indeed different from application to application depending on the needs of the I/O interface being used. In some embodiments, $V_{AUX}$ is a programmable feature or user selectable value.

Bias circuits 210 and 220 illustrate a simple way to provide the IIN_bias and IOUT_bias signals, but numerous other bias circuits will be known to those having ordinary skill in the art. The simplicity of this design contributes further current consumption and circuit area savings over LVDS implementations. For example, traditional LVDS circuits often use bandgap reference voltage circuits to generate predetermined $V_{OS}$ values for locking in circuit operation. As will be well known to those having ordinary skill in the art, effective bandgap circuitry can be difficult to design, can require different manufacturing processes (i.e., analog circuit processes), and can be expensive in terms of power consumption and circuit area.

Operation of system 200 can be further illustrated with reference to two operating conditions, operation when the input signal has transitioned from a logic high value (e.g., "1") to a logic low value (e.g., "0"), and operation when the input signal has transitioned from a logic low value to a logic high value.

When the input signal at output driver 210 is logic low, NMOS transistor N1 is turned off, and NMOS transistor N2 is turned on by virtue of the output of inverter INV3. This arrangement pulls output terminal $B_{OUT}$ low. With $B_{OUT}$ low, input driver terminal $B_{IN}$ is also pulled low, and thus node $A_{IN}$ has a higher potential than $B_{IN}$. With $B_{IN}$ low, NMOS transistors N4 and N5 (whose gates are coupled to $B_{IN}$ through respective inverters INV1 and INV2) turn on. Current is thus allowed to flow from PMOS transistor P1 through NMOS transistor N4 and across the termination resistors. Similarly, current also flows from PMOS transistor P2 through NMOS transistor N5 and into node $B_{IN}$.

In the other operating condition, a logic high input signal at output driver 210 causes NMOS transistor N1 to turn on and NMOS transistor N2 to turn off. This arrangement pulls output terminal $A_{OUT}$ low. With $A_{OUT}$ low, input driver terminal $A_{IN}$ is also pulled low, and thus node $B_{IN}$ has a higher potential than $A_{IN}$. With $A_{IN}$ low, NMOS transistors N4 and N5 turn on. Current is thus allowed to flow from PMOS transistor P1 through NMOS transistor N4 to node $A_{IN}$. Similarly, current also flows from PMOS transistor P2 through NMOS transistor N5 and across the termination resistors to node $A_{IN}$.

Figure 3A:
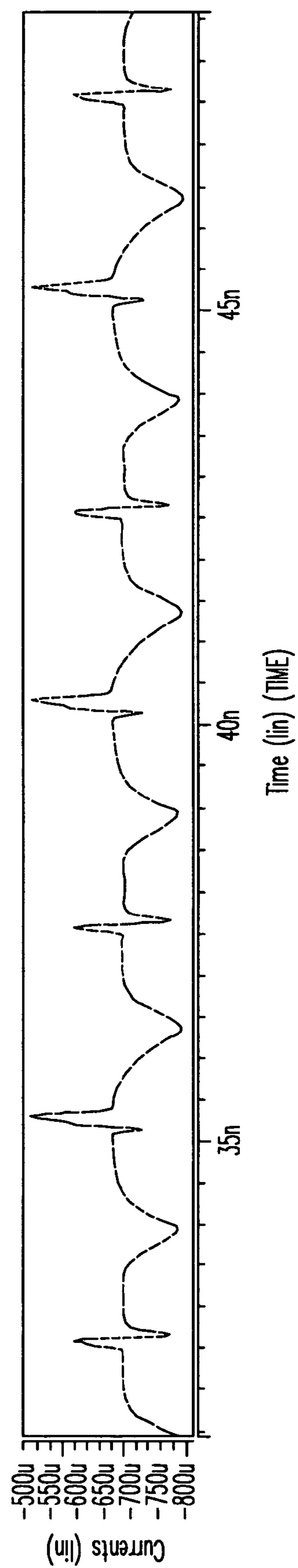
FIGS. 3A-3D illustrate traces of simulated waveforms describing operation of LCDS circuits.
Figure 3B:
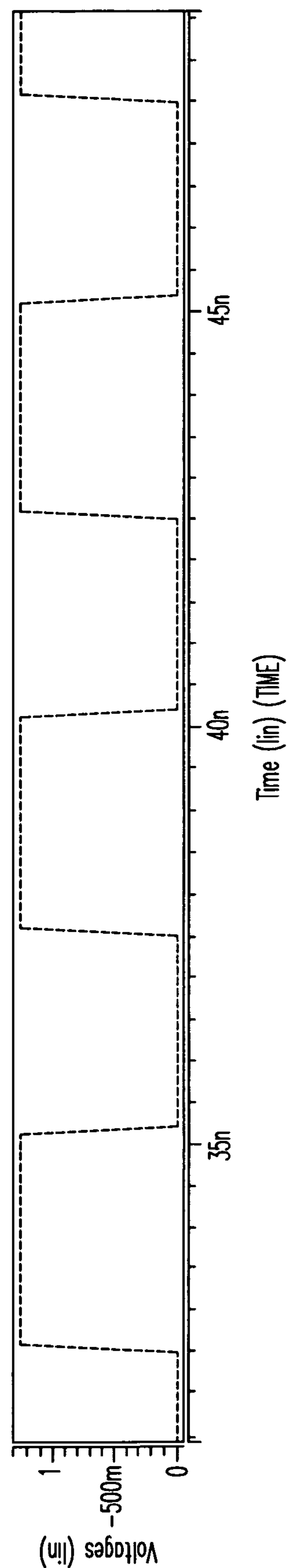
Figure 3C:
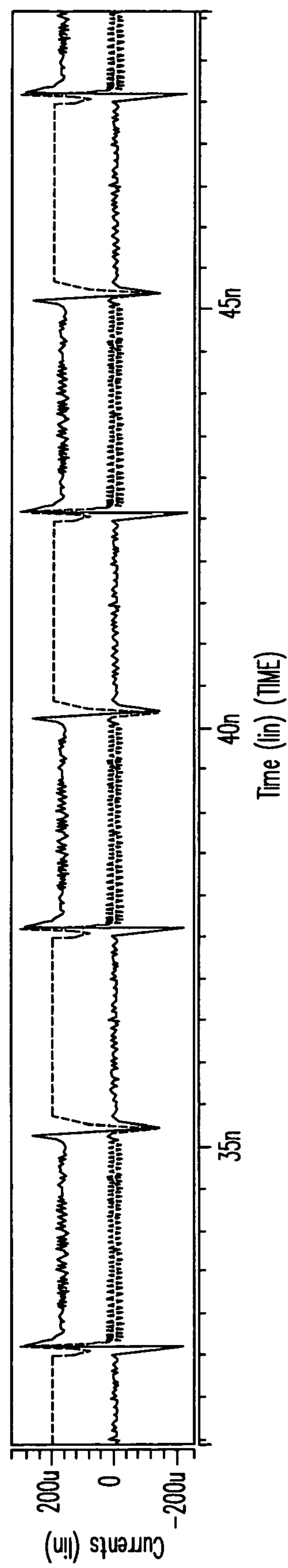
Figure 3D:
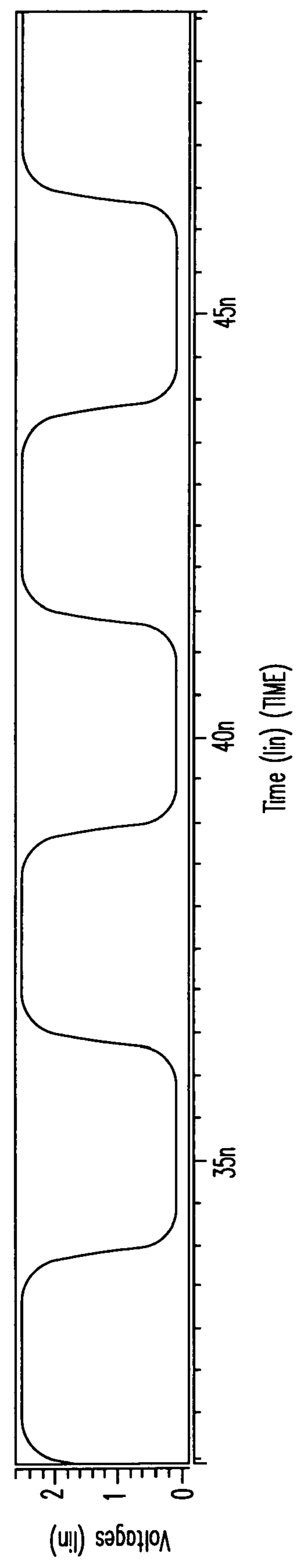

The voltage values at $A_{IN}$ and $B_{IN}$ typically do not move much, and their absolute difference is a system parameter selected by design. Because the voltages are low and they do not move much, very little power is consumed on the signal transmission lines between output driver 210 and input driver 220. FIGS. 3A-3D illustrate traces of simulated waveforms describing operation of LCDS circuits such as those illustrated in FIG. 2. FIG. 3A shows the total current consumption (e.g., from the I/O power supply) as a function of time. As illustrated, total current consumption does not exceed 800 μA. For reference, FIG. 3B shows the corresponding waveform for the input signal at an LCDS output driver. The period of the input signal is 5 ns, corresponding to a data rate of 400 Mb/s. FIG. 3C illustrates the currents at $A_{IN}$ (top trace) and $B_{IN}$ (bottom trace) during circuit operation. Finally, FIG. 3D shows the output signal from the LCDS input driver. The simulation shows that even at high data rates, operation of the LCDS circuits provides good data resolution and low power consumption.

Figure 4:
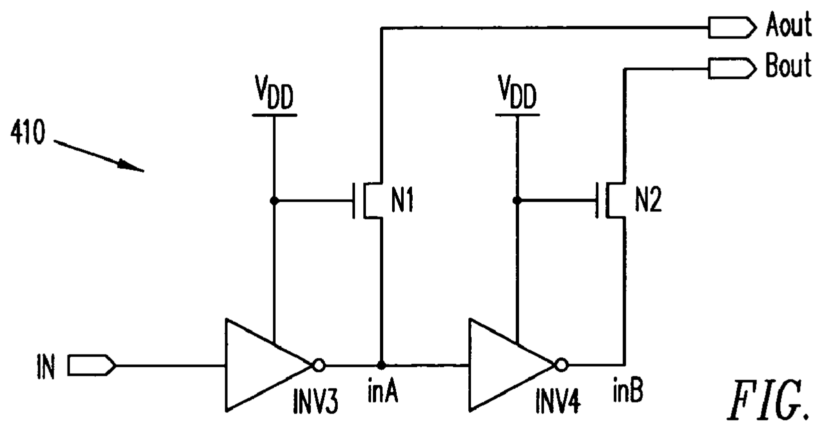
FIG. 4 illustrates a schematic diagram of alternate embodiment of an LCDS output driver.

FIG. 4 provides another example of an LCDS output driver that can be implemented. In particular, the output driver 410 of FIG. 4 can be used in conjunction with input driver 220 of FIG. 2. In this example, output driver 410 is a two sided current generator, with one pulling down (sink) and one pushing (source) to make the swing of signals at terminals $A_{OUT}$ and $B_{OUT}$ faster and generally more robust. Thus, when the input signal is high, inverter INV3 inverts the signal, causing $A_{OUT}$ to be low with respect to $B_{OUT}$, which has been pushed high again by inverter INV4. Similarly, when the input signal is low, inverter INV3 inverts the signal, causing $A_{OUT}$ to be high with respect to $B_{OUT}$. While output driver 410 does possess the aforementioned advantages, it will typically consume more power than output driver 210 because there is a small but constant standby current flowing from power supplies $V_{DD}$ via the termination resistors coupled to the LCDS input driver. Nevertheless, output driver 410 eliminates the need for a biasing circuit such as circuit 230 of FIG. 2.

Figure 5:
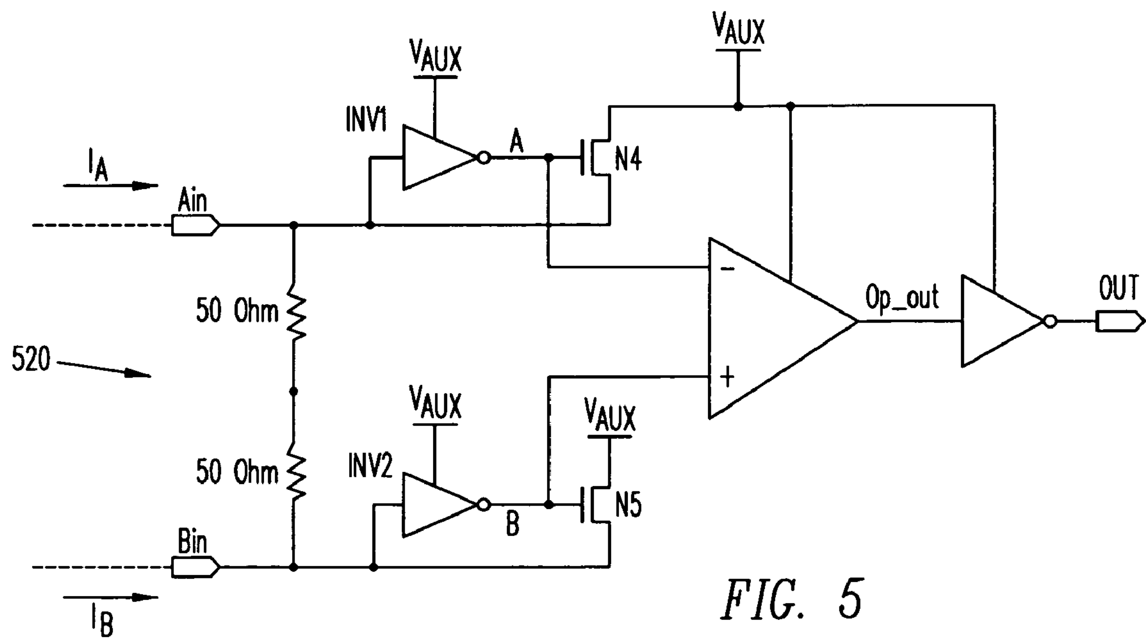
FIG. 5 illustrates a schematic diagram of alternate embodiment of an LCDS input driver.

FIG. 5 illustrates another example of an LCDS input driver that can be implemented. More specifically, input driver 520 of FIG. 5 can be used in conjunction with either of output driver 210 or output driver 410. In this example, input driver 520 is further simplified by eliminating PMOS transistors P1 and P2, as well as associated bias circuitry.

Figure 6:
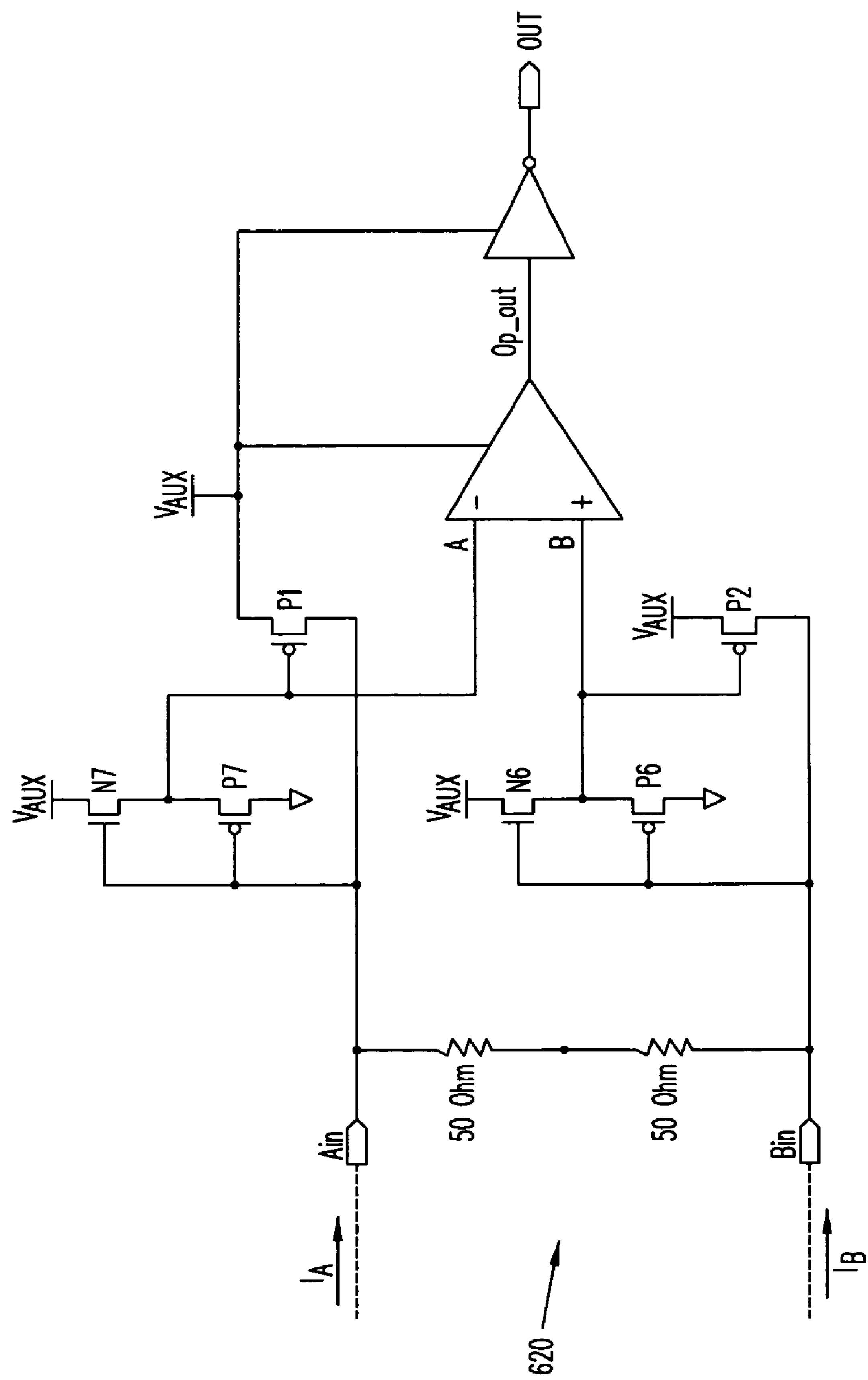
FIG. 6 illustrates a schematic diagram of still another alternate embodiment of an LCDS input driver.

FIG. 6 illustrates another example of an LCDS input driver that can be implemented. More specifically, input driver 620 of FIG. 6 can be used in conjunction with any of the LCDS output drivers described in the present application. For input driver 620, INV1, INV2, N4, and N5 are eliminated, as compared to input driver 220, and NMOS transistors N6 and N7, as well as PMOS transistors P6 and P7 are included. In this configuration followers formed by transistors N7 and P7, and transistors N6 and P6, respectively, operate as input buffers. Their outputs do not swing from rail to rail (e.g., 0 volts to $V_{AUX}$). Instead, the outputs of these followers only swing from a $V_{Tp}$ above 0V to $V_{Tn}$ below from $V_{AUX}$. This is typically acceptable because PMOS transistors P1 and P2 are never completely off or completely on intentionally. Similarly, nodes A and B should never be at either rail intentionally in order to have the ability to switch the differential amplifier rapidly.

Figure 7A:
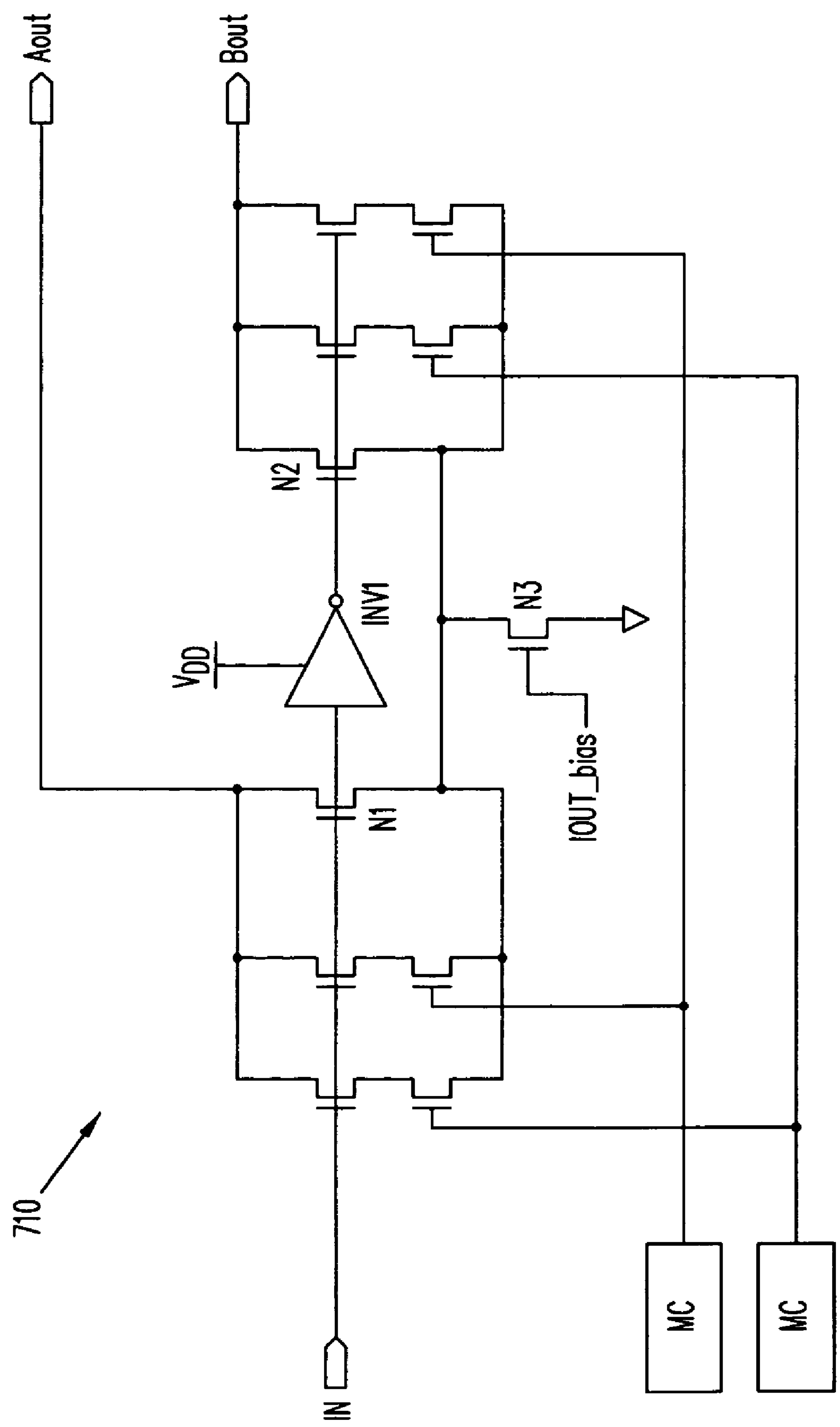
FIGS. 7A-7B illustrate schematic diagrams of yet another LCDS circuit implementation.
Figure 7B:
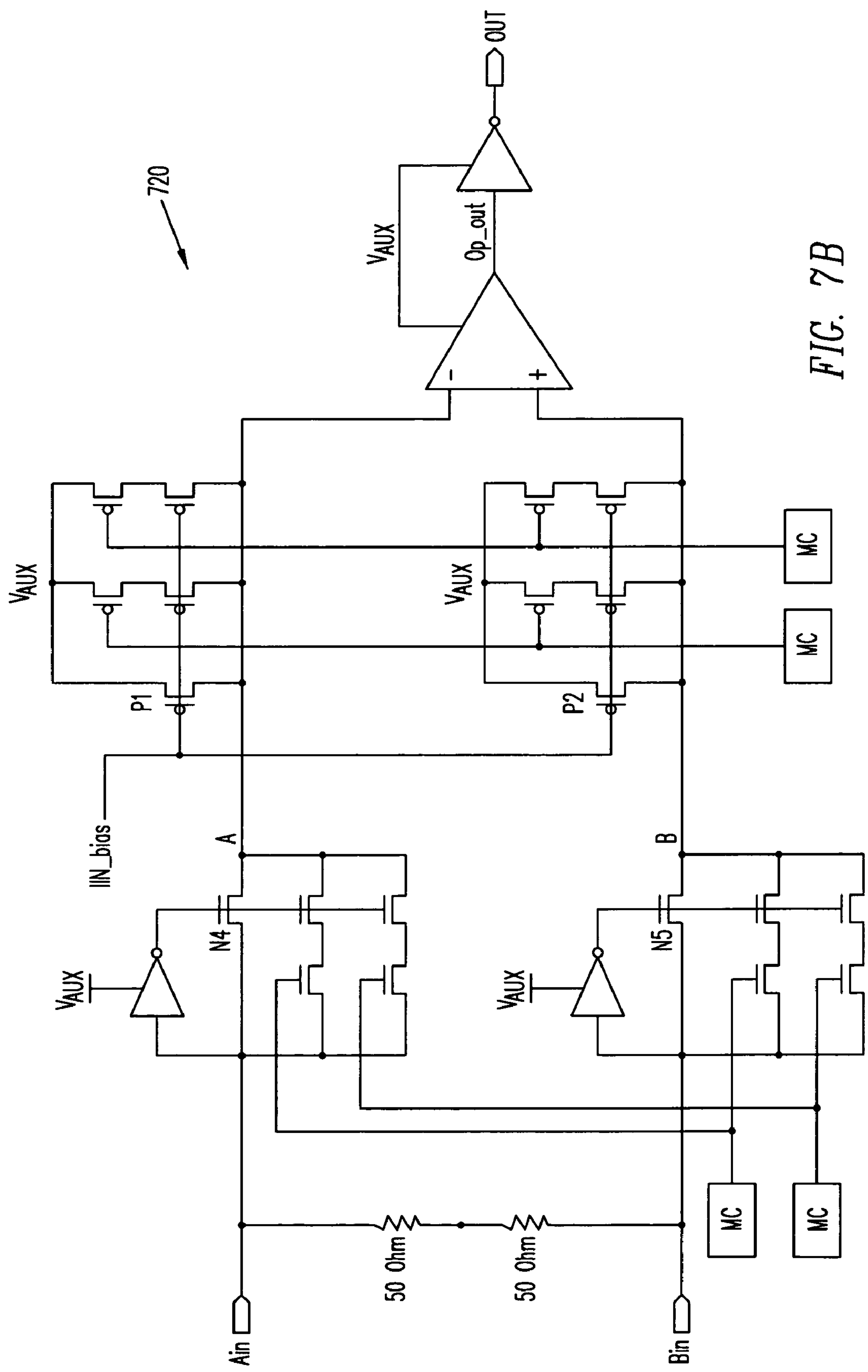

Because key operating characteristics of an LCDS system can be affected by the pull down current used by the system, implementations where that current can be adjusted or programmed are also useful. FIGS. 7A and 7B illustrate programmable LCDS output and input drivers, respectively. Output driver 710 is a variation of the basic design of output driver 210. However, in the case of output driver 710, additional switches are included in the two current pull down paths so that the amount of pull down current can be varied. Control of these additional switches is typically exercised in a symmetrical manner, i.e., each of the two pull down paths are similarly configured, so that pull down currents are well regulated. In other embodiments, this need not be the case. As shown, output driver 710 includes memory cells MC which are programmed to control the additional switches according to desired pull down current values.

Memory cells MC can be arranged and configured in a number of different ways, as will be well known to those having ordinary skill in the art. Memory cells MC are typically formed from some combination of volatile configuration memory (e.g., SRAM) and/or nonvolatile memory (e.g., flash memory). The nonvolatile/volatile configuration memory may or may not be located on the same integrated circuit die as the rest of the device itself. Thus, for example, it might be implemented as an off-chip ROM, on-chip EECMOS cells, conventional RAM, or the like. Similarly, the programming could be more permanent (and thus memory cells MC are less like conventional memory structures), using, for example, anti-fuse technology, laser trimming of conductive paths, and the like. In some embodiments, additional control circuitry (not shown) allows for the programming of memory cells MC. In one embodiment, memory cells MC are configuration memory cells in a Programmable Logic Device (PLD) such as a complex programmable logic device (CPLD) or Field Programmable Gate Array (FPGA).

Similarly, input driver 720 is a variation of the basic design of input driver 220. In the case of input driver 720, two sets of programmable switches are included in the current paths so that the amount of pull down current can be varied. Additional switches are added in parallel with both the NMOS and PMOS transistors to provide full programmability of the pull down currents. As with output driver 710, memory cells MC can be implemented in numerous different ways, and are typically employed along with corresponding transistors in the symmetrical configuration as shown. Again, the symmetrical implementation need not be the case for all embodiments. It will be appreciated that programmable functionality and additional switches in the current paths can generally be used with any suitable output driver or input driver architecture. Moreover, both input driver and output driver need not have such programmable features (or even the same programmable features). Thus, numerous variations will be understood by those having ordinary skill in the art.

The LCDS circuits and techniques described herein can be implemented as standalone devices, or, more commonly, integrated into some type of integrated circuit possessing additional functionality. Such integrated circuits can include devices such as processors, microcontrollers, application specific integrated circuits (ASICs), and programmable logic devices (PLDs) such as, programmable logic arrays (PLAs), complex programmable logic devices (CPLDs), and field programmable gate arrays (FPGAs). Moreover, multiple instances of the same or different types of LCDS drivers can be implemented on the same integrated circuit as desired.

In embodiments where the LCDS devices are part of more generally programmable circuits (e.g., FPGAs, CPLDs, etc.) the programmability of certain features can be integrated into the programming framework for the complete integrated circuit. Thus, for example, when implemented in an FPGA, memory cells such as those illustrated in FIGS. 7A and 7B can be part of the internal memory cells used to customize the configuration and operation of various input/output blocks (IOBs), configurable logic blocks (CLBs), and/or programmable interconnect common to such devices. LCDS drivers can be included in, or implemented using, programmable blocks of FPGAs, PLDs, CPLDs, and the like.

Numerous variations and modifications to the circuits described in FIGS. 1, 2, and 4-7B will be known to those having ordinary skill in the art. For example, many of the resistors illustrated can be implemented using a variety of programmable and/or trimable devices. Similarly, the disclosed devices and techniques are not necessarily limited by any transistor, resistor, or other component size or by voltage levels disclosed herein. Moreover, implementation of the disclosed devices and techniques is not limited by process technology, and thus implementations can utilize CMOS, NMOS, PMOS, and various bipolar or other semiconductor fabrication technologies. While the disclosed devices and techniques have been described in light of the embodiments discussed above, one skilled in the art will also recognize that certain substitutions may be easily made in the circuits without departing from the teachings of this disclosure. For example, a variety of logic gate structures may be substituted for the logic circuits shown, and still preserve the operation of the circuit, in accordance with DeMorgan's law. Also, many circuits using NMOS transistors may be implemented using PMOS transistors instead, as is well known in the art, provided the logic polarity and power supply potentials are reversed. In this vein, the transistor conductivity type (i.e., N-channel or P-channel) within a CMOS circuit may be frequently reversed while still preserving similar or analogous operation. Moreover, other combinations of output stages are possible to achieve similar functionality.

Regarding terminology used herein, it will be appreciated by one skilled in the art that any of several expressions may be equally well used when describing the operation of a circuit including the various signals and nodes within the circuit. Any kind of signal, whether a logic signal or a more general analog signal, takes the physical form of a voltage level (or for some circuit technologies, a current level) of a node within the circuit. Such shorthand phrases for describing circuit operation used herein are more efficient to communicate details of circuit operation, particularly because the schematic diagrams in the figures clearly associate various signal names with the corresponding circuit blocks and node names.

Although the present invention has been described with respect to a specific preferred embodiment thereof, various changes and modifications may be suggested to one skilled in the art and it is intended that the present invention encompass such changes and modifications that fall within the scope of the appended claims.

The invention claimed is:

1. A circuit comprising:

a first input driver terminal operable to be coupled to a first transmission line;

a second input driver terminal operable to be coupled to a second transmission line;

at least one termination resistor coupled between the first input driver terminal and the second input driver terminal;

a current-to-voltage converter coupled to the first input driver terminal and the second input driver terminal, wherein the current-to-voltage converter is configured to sense changing current levels at the first input driver terminal and the second input driver terminal, and produce a differential voltage signal; and a differential amplifier coupled to the current-to-voltage converter to receive the differential voltage signal, wherein the differential amplifier is configured to produce an output signal based on the differential voltage signal.

2. The circuit of claim 1 further comprising:

a first transistor coupled between a power source and the first input driver terminal, and configured to supply current through the first input driver terminal; and a second transistor coupled between the power source and the second input driver terminal, and configured to supply current through the second input driver terminal.

3. The circuit of claim 2 wherein at least one of the first transistor and the second transistor further comprises a plurality of transistors, and wherein at least one of the plurality of transistors is operable to be selectively activated to vary an amount of supply current.

4. The circuit of claim 3 further comprising:

a memory coupled to the at least one of the plurality of transistors.

5. The circuit of claim 2 wherein at least one of the first transistor and the second transistor further comprises a follower circuit.

6. The circuit of claim 1 further comprising:

an output driver, wherein the output driver includes:

an input signal terminal;

a first output driver terminal;

a second output driver terminal, wherein the output driver is configured to control current flow through the first output driver terminal and the second output driver terminal according to an input signal received at the input signal terminal.

7. The circuit of claim 6 wherein the output driver further comprises a pull down current source.

8. The circuit of claim 6 further comprising:

a first transistor coupled between the first output driver terminal and ground, and configured to control current through the first output driver terminal; and a second transistor coupled between the second output driver terminal and ground, and configured to control current through the second output driver terminal.

9. The circuit of claim 8 wherein at least one of the first transistor and the second transistor further comprises a plurality of transistors, the circuit further comprising:

a memory coupled to the at least one of the plurality of transistors.

10. The circuit of claim 6 further comprising:

a first transistor coupled between the first output driver terminal and the input signal terminal, and configured to control current through the first output driver terminal; and a second transistor coupled between the second output driver terminal and the input signal terminal, and configured to control current through the second output driver terminal.

11. The circuit of claim 1 wherein the circuit is formed on an integrated circuit die, and wherein the integrated circuit die is at least one of a processor, a microcontroller, an application specific integrated circuit (ASIC), or a programmable logic device (PLD).

12. A method comprising:

receiving a differential current signal from a pair of signal transmission lines;

converting the differential current signal to a differential voltage signal;

amplifying the differential voltage signal to form a single-ended output signal; and programmably controlling at least one transistor to selectively vary an amount of current supplied to at least one of the pair of signal transmission lines.

13. The method of 12 further comprising:

receiving a single-ended input signal; and selectively controlling current flow at a first output driver terminal and a second output driver terminal according to the single-ended input signal.

14. The method of 13 wherein the selectively controlling current flow further comprises generating the differential current signal, the method further comprising:

transmitting the differential current signal on the pair of signal transmission lines.

15. The method of 12 further comprising:

supplying a current to at least one of the pair of signal transmission lines.

16. The method of 12 further comprising:

terminating the pair of signal transmission lines with at least one resistor.

17. An apparatus comprising:

a means for receiving a differential current signal from a pair of signal transmission lines;

a means for converting the differential current signal to a differential voltage signal;

a means for amplifying the differential voltage signal to form a single-ended output signal; and a means for programmably controlling at least one means for switching to selectively vary an amount of current supplied to at least one of the pair of signal transmission lines.

18. The apparatus of claim 17 further comprising:

a means for receiving a single-ended input signal; and a means for selectively controlling current flow at a first output driver terminal and a second output driver terminal according to the single-ended input signal.

* * * * *